United States Patent
Yang et al.

(10) Patent No.: US 10,747,680 B2
(45) Date of Patent: Aug. 18, 2020

(54) STORAGE DEVICE, STORAGE SYSTEM COMPRISING THE SAME, AND OPERATING METHODS OF THE STORAGE DEVICE

(71) Applicant: SAMSUNG ELECTRONICS CO., LTD., Suwon-si, Gyeonggi-Do (KR)

(72) Inventors: Woo Young Yang, Suwon-si (KR); Heon Gwon Lee, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 153 days.

(21) Appl. No.: 15/860,511

(22) Filed: Jan. 2, 2018

(65) Prior Publication Data

US 2018/0373642 A1    Dec. 27, 2018

(30) Foreign Application Priority Data

Jun. 21, 2017 (KR) .................. 10-2017-0078437

(51) Int. Cl.
*G06F 12/1009* (2016.01)
*G06F 12/12* (2016.01)
(Continued)

(52) U.S. Cl.
CPC ...... *G06F 12/1009* (2013.01); *G06F 12/0246* (2013.01); *G06F 12/12* (2013.01); *G11C 11/5642* (2013.01); *G06F 2212/1024* (2013.01); *G06F 2212/202* (2013.01); *G06F 2212/657* (2013.01); *G06F 2212/7201* (2013.01); *G11C 2211/5641* (2013.01)

(58) Field of Classification Search
CPC .............. G06F 12/1009; G06F 12/12; G06F 2212/657; G06F 2212/202; G06F 12/0246; G06F 2212/7201; G06F 2212/1024; G11C 2211/5641; G11C 11/5642
USPC ..................................................... 711/103
See application file for complete search history.

(56) References Cited

U.S. PATENT DOCUMENTS 7,908,436 B1 *  3/2011  Srinivasan ............ G06F 3/0622
                                                         711/114
8,037,277 B2   10/2011  Maeda et al.
(Continued)

FOREIGN PATENT DOCUMENTS

JP     5059493 B2   10/2012
KR     1400506 B1    5/2014

*Primary Examiner* — David Yi
*Assistant Examiner* — Zubair Ahmed
(74) *Attorney, Agent, or Firm* — Volentine, Whitt & Francos, PLLC

(57) ABSTRACT

A storage device, a storage system comprising the same, and operating methods of the storage device are provided. The storage device includes a first nonvolatile memory cell array which includes a plurality of cell strings arranged in a direction perpendicular to a substrate, and stores first data at a first address, a second nonvolatile memory cell array which stores second data selected from the first data at a second address, in accordance with an access pattern to the first data, and a memory controller which manages a first mapping table indicating that the second data is stored at the second address of the second nonvolatile memory cell array, and a second mapping table indicating that the first data as original data of the second data is stored at the first address.

15 Claims, 14 Drawing Sheets

(51) Int. Cl.
    *G06F 12/02*    (2006.01)
    *G11C 11/56*    (2006.01)

(56) References Cited

U.S. PATENT DOCUMENTS

| | | |
|---|---|---|
| 9,208,074 B2 | 12/2015 | Cheng |
| 9,594,693 B2 | 3/2017 | Sutardja |
| 2010/0318839 A1* | 12/2010 | Avila .................. G06F 12/0802 |
| | | 714/5.11 |
| 2011/0179219 A1 | 7/2011 | Ma et al. |
| 2012/0017039 A1* | 1/2012 | Margetts ................. G06F 12/08 |
| | | 711/105 |
| 2013/0275661 A1* | 10/2013 | Zimmer .............. G06F 12/0246 |
| | | 711/103 |
| 2014/0365722 A1 | 12/2014 | Yi et al. |
| 2015/0331806 A1 | 11/2015 | Mondal et al. |
| 2016/0077962 A1* | 3/2016 | Ehrlich .................... G06F 3/06 |
| | | 711/103 |
| 2016/0098351 A1* | 4/2016 | Bahn .................. G06F 12/0246 |
| | | 711/144 |
| 2016/0188210 A1* | 6/2016 | Tanzawa ............... G06F 3/0604 |
| | | 711/154 |
| 2016/0239205 A1* | 8/2016 | Rothberg ................ G06F 3/064 |
| 2016/0320981 A1 | 11/2016 | Sutardja |
| 2017/0060434 A1 | 3/2017 | Chang et al. |
| 2017/0060472 A1 | 3/2017 | Zhuang et al. |

* cited by examiner

FIG. 10C

| | LPN | PPN 1 | |
|---|---|---|---|
| 261_1 → | 0 | 0x0000 | ← 262_1 |
| 261_2 → | 1 | 0x0001 | ← 262_2 |
| 261_3 → | 2 | 0x0002 | ← 262_3 |
| 261_4 → | 3 | 0x0003 | ← 262_4 |
| | ..... | ..... | |

260

| | Index | PPN 2 | |
|---|---|---|---|
| | ..... | ..... | |
| 271_1 → | 2 | 0x000F | ← 272_1 |
| 271_2 → | | | ← 272_2 |
| | ..... | ..... | |

270

STORAGE DEVICE, STORAGE SYSTEM COMPRISING THE SAME, AND OPERATING METHODS OF THE STORAGE DEVICE

This application claims priority from Korean Patent Application No. 10-2017-0078437 filed on Jun. 21, 2017 in the Korean Intellectual Property Office, the disclosure of which is incorporated herein by reference in its entirety.

BACKGROUND OF THE INVENTION

Field of the Invention

The present invention relates to a storage device, a storage system including the storage device, and a method for operating the storage device. More specifically, the present invention relates to a storage device including different kinds of nonvolatile memories, a storage system including the storage device, and a method for operating the storage device.

Description of the Related Art

In general, semiconductor memory devices may be categorized as either volatile memory devices in which stored information disappears with the interruption of a power supply, and a nonvolatile memory device capable of continuously keeping the stored information even when the power supply is interrupted. One type of nonvolatile memory device which has been widely used recently is a NAND flash device. In order to improve the integration degree of the NAND flash device, a NAND flash device of vertically stacked structure was introduced.

As a storage device using such a NAND flash device, a structure having a cache memory with less latency for obtaining a higher performance is proposed.

SUMMARY OF THE INVENTION

An aspect of the present invention provides a storage device including different kinds of nonvolatile memories.

Another aspect of the present invention provides a storage system including the storage device including different kinds of nonvolatile memories.

Still another aspect of the present invention provides a method for operating the storage device including different kinds of nonvolatile memories.

The aspects of the present invention are not limited to those mentioned above but other aspects which are not mentioned above can be clearly understood by those skilled in the art from the description below.

In accordance with an aspect of the present invention, a storage device includes: a first nonvolatile memory cell array which includes a plurality of cell strings arranged in a direction perpendicular to a substrate, and which is configured to store first data at a first address; a second nonvolatile memory cell array which is configured to store at a second address second data selected from the first data, wherein the second data is selected in accordance with a pattern of accessing the first data; and a memory controller which is configured to manage a first mapping table indicating that the second data is stored in the second address of the second nonvolatile memory cell array, and to manage a second mapping table indicating that the first data as an original data of the second data is stored in the first address.

In accordance with another aspect of the present invention, a storage system includes: a host; a first solid state drive (SSD) which includes a plurality of cell strings arranged in a direction perpendicular to a substrate, and which is configured to store first data at a first address; a second SSD which is configured to store at a second address second data selected from the first data, wherein the second data is selected in accordance with a pattern of accessing the first data; and a storage controller which is configured to provide read data to the host from the first SSD or the second SSD in accordance with a read command provided from the host, wherein the storage controller is configured to manage a first mapping table indicating that the second data is stored in the second address of the second SSD, and a second mapping table indicating that the first data as an original data of the second data is stored in the first address.

In accordance with yet another aspect of the present invention, a method is provided for operating a storage device. The method includes storing first data at a first address of a first nonvolatile memory cell array, the first nonvolatile memory cell array including a plurality of cell strings arranged in a direction perpendicular to a substrate, storing second data selected from the first data at a second address of a second nonvolatile memory cell array, wherein the second data is selected in accordance with a pattern of accessing the first data, updating a first mapping table of the storage device so as to indicate that the second data is stored in the second address of the second nonvolatile memory cell array, and updating a second mapping table of the storage device to indicate that the first data, which is original data of the second data, is stored in the first address.

In accordance with still another aspect of the present invention, a storage device comprises: a first nonvolatile memory cell array which is configured to store first data at a first address; a second nonvolatile memory cell array which is configured to store at a second address second data selected from the first data, wherein the second data is selected in accordance with a pattern of accessing the first data, wherein a latency time for accessing the second data in the second nonvolatile memory cell array is less than the latency time for accessing the first data in the first nonvolatile memory cell array; an internal memory configured to store therein a first mapping table indicating that the second data is stored at the second address of the second nonvolatile memory cell array, and a second mapping table indicating that the first data as original data of the second data is stored at the first address; and a memory controller which is configured to manage the first mapping table and the second mapping table.

BRIEF DESCRIPTION OF THE DRAWINGS

The above and other aspects and features of the present invention will become more apparent by describing in detail exemplary embodiments thereof with reference to the attached drawings.

FIG. 2b is a circuit diagram of a portion of the first nonvolatile memory cell array of FIG. 2a.

FIGS. 10a, 10b and 10c are schematic views for explaining the operation of the storage device according to some embodiments of the present invention.

DETAILED DESCRIPTION OF THE INVENTION

Hereinafter, a semiconductor device according to some embodiments of the present invention will be described with reference to FIGS. 1 to 11.

Figure 1:
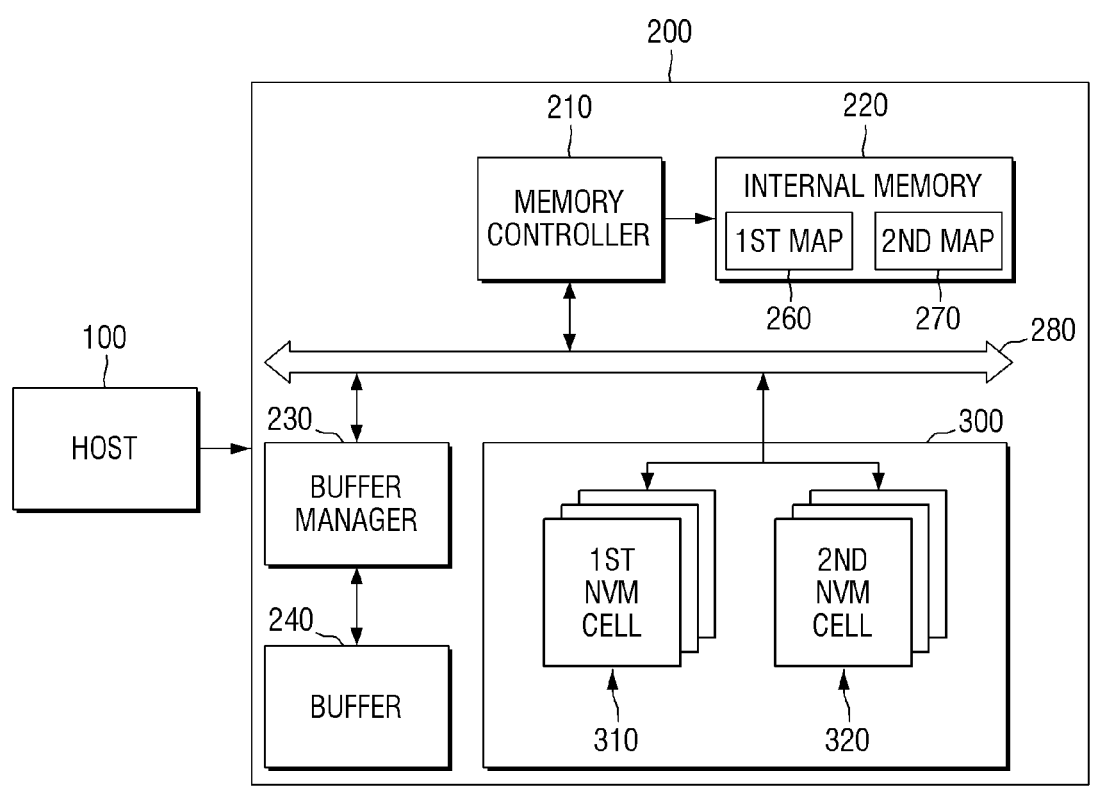
FIG. 1 is a block diagram illustrating a storage system including a storage device according to some embodiments of the present invention.

FIG. 1 is a block diagram illustrating a storage system including a storage device according to some embodiments of the present invention.

Referring to FIG. 1, a storage system including a storage device according to some embodiments of the present invention may include a host 100 and a storage device 200.

Host 100 may control the data processing operation of storage device 200, that is, the data-writing operation or the data-reading operation, using the application or the file system. Specifically, host 100 may provide a random read command or sequential read command to storage device 200, or may provide a random write command or sequential write command to storage device 200, but the present invention is not limited thereto. For example, host 100 may indicate a host controller.

Here, a sequential read command refers to a case in which a read command to consecutive addresses is continuously provided on the basis of the data address which is a target of the read command. Similarly, a sequential write command refers to a case where a write command to consecutive addresses is continuously provided on the basis of the data address which is a target of the writing command.

Conversely, the random read command refers to a read command of an arbitrary or sporadic address rather than the read command of consecutive addresses, and the random write command also refers to a write command of an arbitrary or sporadic address rather than the write command of consecutive addresses.

For example, host 100 may exchange data with storage device 200 via any one interface of a Universal Serial Bus (USB), a Small Computer System Interface (SCSI), a PCI express, an ATA, a Parallel ATA (PATA), a Serial ATA (SATA), a Serial Attached SCSI (SAS), and a Non Volatile Memory express (NVMe), but the present invention is not limited thereto.

Storage device 200 may include, for example, a memory controller 210, an internal memory 220, a buffer manager 230, a buffer 240, an internal interface 280, and nonvolatile memory 300. However, the present invention is not limited thereto. In some embodiments of the present invention, host 100 and storage device 200 may be provided as separate electronic devices. However, the present invention is not limited thereto, and host 100 and storage device 200 may be integrated in a single device.

Storage device 200 may be a flash memory-based storage device, and more specifically, storage device 200 may be a solid state drive (SSD). As will be described later, storage device 200 may use the nonvolatile memory device to store the data provided from the host, or may read the stored data and provide the data to the host.

Memory controller 210 may manage internal memory 220, buffer manager 230, and the like via internal interface 280. Memory controller 210 may store, for example, firmware for controlling the operation of storage device 200.

Memory controller 210 may control nonvolatile memory 300, using a first mapping table 260 and a second mapping table 270 stored in internal memory 220. Implementation of memory controller 210, and first mapping table 260 and second mapping table 270 using the same will be described below.

Internal memory 220 may store first mapping table 260 necessary for operations of first nonvolatile memory cell array 310 and second nonvolatile memory cell array 320, second mapping table 270. Internal memory 220 provides the physical page number in which data is stored from first mapping table 260 and second mapping table 270 under the control of memory controller 210, and memory controller 210 may access the data stored in nonvolatile memory 300 from the provided physical page number.

Internal memory 220 may include, for example, a volatile memory, specifically, internal memory 220 may include a Dynamic Random Access Memory (DRAM) or Static Random Access Memory (SRAM), but the present invention is not limited thereto.

When internal memory 220 includes, for example, a DRAM or an SRAM, the operation speed of internal memory 220 may be faster than that of first nonvolatile memory cell array 310 or second nonvolatile memory cell array 320. On the other hand, the storage capacity of internal memory 220 may be smaller than that of first nonvolatile memory cell array 310 or second nonvolatile memory cell array 320.

Nonvolatile memory 300 may store data provided from host 100 or may read data stored therein in response to a request from host 100 and provide data to host 100.

Nonvolatile memory 300 may include a first nonvolatile memory cell array 310 and a second nonvolatile memory cell array 320. FIG. 1 illustrates a configuration in which first nonvolatile memory cell array 310 or second nonvolatile memory cell array 320 is made up of a plurality of physical units or a plurality of logical units, respectively, but the present invention is not limited thereto.

First nonvolatile memory cell array 310 will be described with reference to FIGS. 2a and 2b.

Figure 2A:
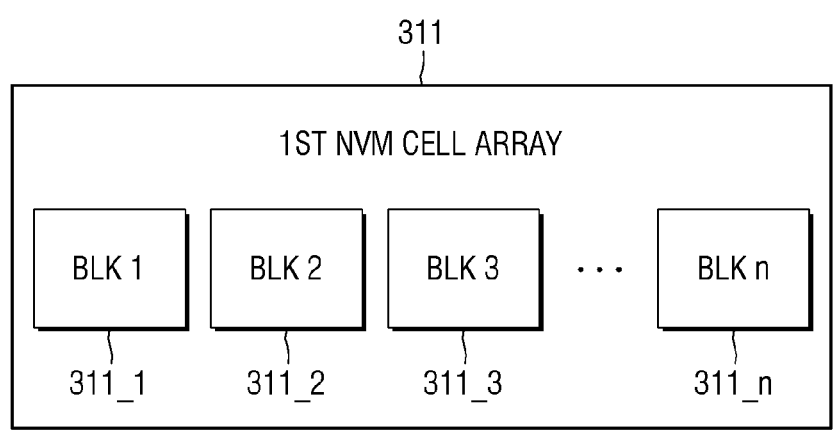
FIG. 2a is a block diagram illustrating an example of a first nonvolatile memory cell array of FIG. 1.
Figure 2B:
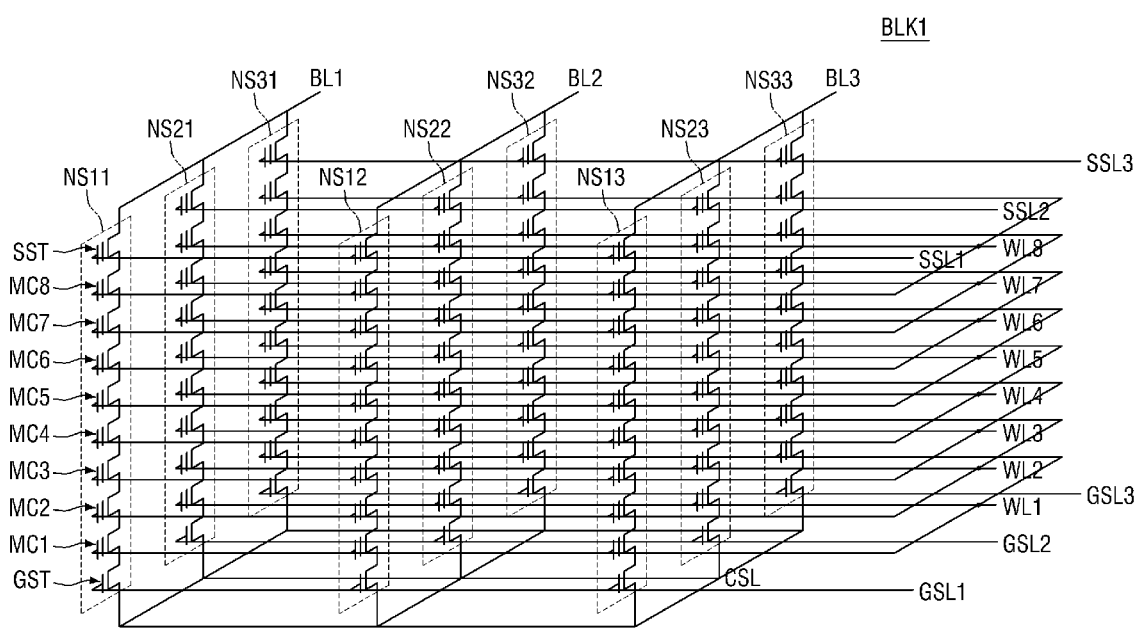

FIG. 2a is a block diagram illustrating an example embodiment of the first nonvolatile memory cell array of FIG. 1, and FIG. 2b is a circuit diagram of a portion of the first nonvolatile memory cell array of FIG. 2a.

Referring to FIGS. 2a and 2b, first nonvolatile memory cell array 311 may include n first blocks (311_1 to 311_n, where n is a natural number). First nonvolatile memory cell array 311 be one embodiment of nonvolatile memory cell array 310 described above with reference to FIG. 1. Each of first blocks 311_1 to 311_n of first nonvolatile memory cell array 311 is a unit for executing an erase command, that is, a unit in which an erase operation of memory cells is performed at the same time. Each of first blocks (311_1 to 311_n, where n is a natural number) of first nonvolatile memory cell array 311 may include, for example, 128 or 256 pages. A page is a unit or group of memory cells for which the read and write commands are executed.

First nonvolatile memory cell array 311 may include NAND flash memory cells, more specifically, a plurality of string cells arranged in a direction perpendicular to the substrate. Each of first memory blocks 311_1 to 311_n has a three-dimensional structure, and may include a plurality of strings cells NS11 to NS33 extending in the direction perpendicular to the substrate. Each of the plurality of string cells NS11 to NS33 may be connected to a bit line BL, at least one string selection line SSL, at least one ground selection line GSL, a plurality of word lines WL, at least one dummy word line DWL, and a common source line CSL.

The string selection transistors SST of the string cells NS on the same row may share the string selection line SSL. The string selection transistors SST of the string cells NS of different rows may be connected to the different string selection lines SSL1, SSL2, and SSL3.

Memory cells MC1 to MC8 of the same height as string cells NS of the same row may share the word lines WL1 to WL8. At the same height, the word lines WL1 to WL8 connected to the memory cells MC1 to MC8 of the string cells NS of different rows may be connected to each other in common.

As illustrated in FIG. 2b, first nonvolatile memory cell array 311 includes the memory cells MC1 to MC8 formed to be stacked in the vertical direction. However, the structure of the memory cells described with reference to FIGS. 2a and 2b is an example of an arrangement which includes a cell string formed in the vertical direction. However, it will be obvious to those skilled in the art that the vertical memory cells may be formed in a different method or arrangement from the structure of first nonvolatile memory cell array 311 illustrated in FIG. 2a.

Furthermore, first nonvolatile memory cell array 311 may comprise a Multi Level Cell (MLC) memory device or module or a Triple Level Cell (TLC) memory device or module. Therefore, first nonvolatile memory cell array 311 may operate to store two or three bit values in a cell as a minimum unit for storing data.

Referring to FIG. 1 again, second nonvolatile memory cell array 320 is included in nonvolatile memory 300 together with first nonvolatile memory cell array 310, and may store the data provided from host 100 or provide the stored data to host 100 in accordance with the control of memory controller 210.

Second nonvolatile memory cell array 320 may have a configuration different from that of first nonvolatile memory cell array 310. An example of a configuration of second nonvolatile memory cell array 320 will be described in more detail with reference to FIG. 3.

Figure 3:
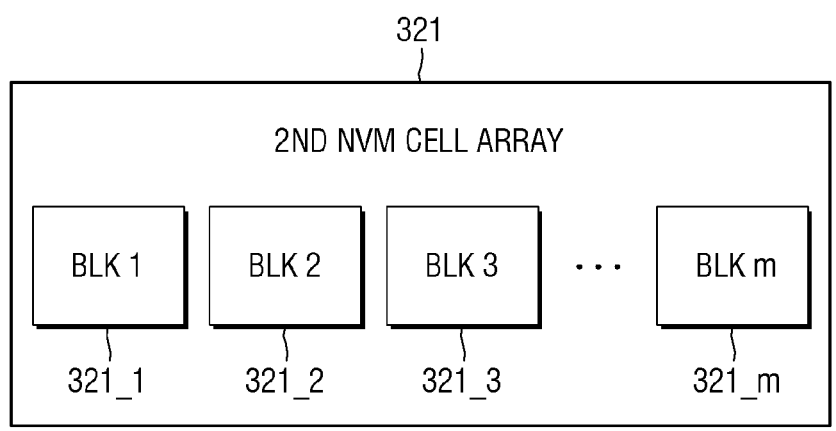
FIG. 3 is a block diagram illustrating an expel embodiment of a second nonvolatile memory cell of FIG. 1.

FIG. 3 is a block diagram illustrating an example embodiment of second nonvolatile memory cell array 320 of FIG. 1.

Referring to FIG. 3, second nonvolatile memory cell array 321 may include m second blocks (321_1 to 321_m, where m is a natural number). Second nonvolatile memory cell array 321 may be one embodiment of second nonvolatile memory cell array 320 described above with reference to FIG. 1. Each of second blocks 321_1 to 321_m of second nonvolatile memory cell 321 may include, for example, 128 or 256 pages. A page is a unit or group of memory cells for which the read and write commands are executed.

Second nonvolatile memory cell array 321 may include, for example, a NAND flash memory cell, and more specifically, a Single Level Cell (SLC) memory device or module. Therefore, second nonvolatile memory cell array 321 may operate to store only one bit value in a memory cell which is the minimum unit for storing data. Further, second nonvolatile memory cell array 321 may be, but is not limited to, a planar type flash memory cell, and second nonvolatile memory cell array 321 may include a plurality of string cells arranged in a direction perpendicular to the substrate, as in first nonvolatile memory cell array 311.

In some embodiments of the present invention, second blocks 311_1 to 311_n included in first nonvolatile memory cell array 311 may be configured to have a first size. On the other hand, second blocks 321_1 to 321_m included in the second nonvolatile memory cell array 321 may be configured to have a second size different from the first size. In some embodiments of the present invention, the first size may be configured to be greater than the second size.

That is, second nonvolatile memory cell array 321 is set to have a block size smaller than that of first nonvolatile memory cell array 311. Therefore, the latency time for accessing data stored in second nonvolatile memory cell array 321 may be smaller (less) than the latency time for accessing data stored in first nonvolatile memory cell array 311.

Although the configuration of second nonvolatile memory cell array 321 has been described on the premise that second nonvolatile memory cell array 321 includes the configuration of a NAND flash memory, the present invention is not limited thereto.

Specifically, second nonvolatile memory cell array 321 may include any one of Phase-change RAM (PRAM), Ferroelectronic RAM (FRAM), Resistive RAM (RRAM) or Magnetoresistive RAM (MRAM). That is, since the above-mentioned constituent elements use phase change substances, ferroelectrics, resistors, and magnetic tunnel junction substances as storage elements as compared with the NAND flash memory that represents data by charging electrons, it is possible to provide a smaller (lower) latency time for accessing data stored therein than the latency time for accessing data stored in the first nonvolatile memory cell array.

Referring to FIG. 1 again, memory controller 210 may communicate with respective components forming storage device 200 via internal interface 280. Internal interface 280 may include, for example, AMBA, AHB, APB, AXI, ASB or a combination thereof, but the present invention is not limited thereto.

Buffer manager 230 may write data on buffer 240 or read data from buffer 240. Buffer manager 230 may include DRAM, SRAM, flash memory, etc., but the present invention is not limited thereto. Next, the operation of the storage device according to some embodiments of the present invention will be described in detail.

Figure 4:
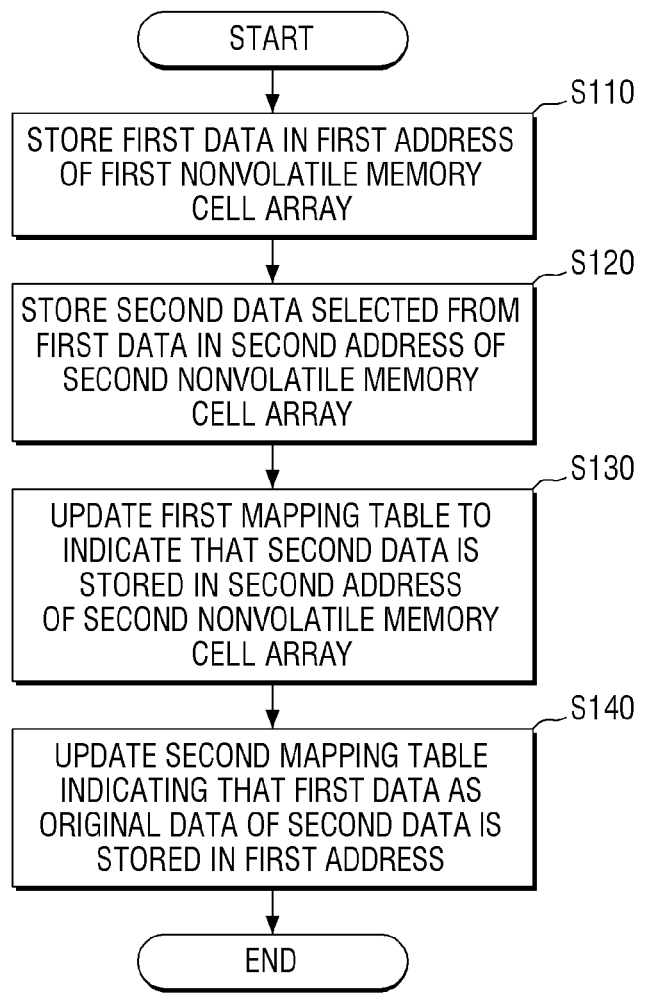
FIG. 4 is a flowchart for explaining the operation of the storage device according to some embodiments of the present invention.

FIG. 4 is a flowchart for explaining the operation of the storage device according to some embodiments of the present invention.

Referring to FIG. 4, in the storage device according to some embodiments of the present invention, a process in which the first data is stored in first nonvolatile memory cell array 310, and second data is stored in second nonvolatile memory cell array 320 will be described.

Specifically, the first data is stored in the first address of first nonvolatile memory cell array 310 (S110), the second data selected from the first data is stored in the second nonvolatile memory (S120), first mapping table 260 is updated to represent or indicate that the second data is stored in the second address of second nonvolatile memory cell array 320 (S130), and second mapping table 270 is updated to represent or indicate that the first data as the original data of the second data is stored in the first address (S140).

The first data stored in the first address of first nonvolatile memory cell array 310, the second data stored in the second address of second nonvolatile memory cell array 320, first mapping table 260 and second mapping table 270 will be described in relation to FIG. 5.

Figure 5:
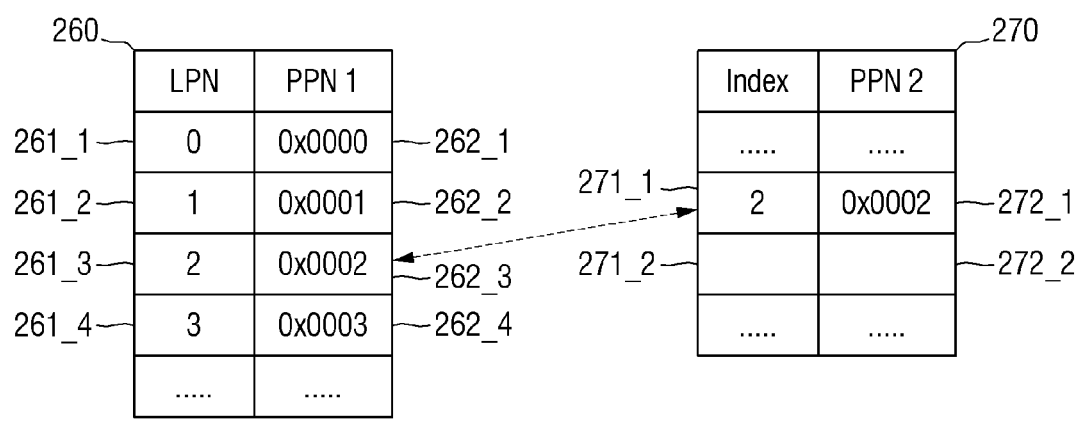
FIG. 5 is a schematic view for explaining the operation of the storage device according to some embodiments of the present invention.

FIG. 5 is a schematic view for explaining the operation of the storage device according to some embodiments of the present invention.

Referring to FIG. 5, an example of first mapping table 260 and second mapping table 270 in the case where each of the first data and the second data selected from the first data is stored is illustrated.

In order to manage the physical page number (PPN) of first nonvolatile memory cell array 310, first mapping table 260 may comprise a page mapping table including a logical page number (LPN) corresponding to the physical page number on a one-to-one basis.

Although it is not illustrated, memory controller 210 may additionally include a converter for converting the addresses from LPN to PPN. When receiving the logical address assigned to the memory map address from host 100, the converter may transfer the physical page number PPN1 of nonvolatile memory 300 corresponding thereto to host 100.

First mapping table 260 stores respective physical page numbers 262_1 to 262_4 corresponding to respective logical page numbers 261_1 to 261_4. Each of physical page numbers 262_1 to 262_4 may refer to the physical numbers in first nonvolatile memory cell array 310 corresponding to logical page numbers 261_1 to 261_4.

A process may be executed in which a part of the first data stored in first address 262_3 in first nonvolatile memory cell array 310 is selected and stored in second nonvolatile memory cell array 320. In some embodiments, the selection of the second data may be a selection of a part of the first data as cache data, in accordance with the cache memory policy. The cache memory policy may be based at least in part on a pattern of accessing the first data. For example, the second data may be selected as data among the first data which is frequently accessed (e.g., the most frequently accessed data among the first data). But the invention is not limited thereto. For example, the policy may also be based at least in part on how recently data among the first data has been accessed (e.g., the second data may be the most recently accessed data among the first data). Indeed the cache memory policy may be one of any of a variety of known cache memory policies which are employed in the art.

Memory controller 210 may select a part of the first data stored in first address 262_3 of first nonvolatile memory cell array 310 and may store the part of the first data as the second data and may store the second data in second nonvolatile memory cell array 320. Further, the firmware of memory controller 210 may store a predetermined policy used for the selection in first nonvolatile memory cell array 310.

Selection of the first data stored in first address 262_3 is performed, and the first data is copied and stored in second nonvolatile memory cell array 320. Specifically, the second data selected from the first data is stored in the second address of second nonvolatile memory cell array 320 (S120). When a part of the first data stored in first address 262_3 of first nonvolatile memory cell array 310 is selected, memory controller 210 may provide the first data to a second address of second nonvolatile memory cell array 320 indicated by a cache index 271_1 of second mapping table 270, and store the first data therein.

As illustrated in second mapping table 270 of FIG. 5, the second data is stored only in the second address indicated by one cache index 271_1 of the two cache indices 271_1 and 271_2, and the second data is not stored in the address indicated by the remaining cache index 271_1. Thus, cache index 271_1 and physical page number 272_2 are kept blank. However, the present invention is not limited thereto, and other predetermined values may be recorded for non-stored cache indexes and physical page numbers, and memory controller 210 may determine that the second data is not stored when searching the cache index.

First mapping table 260 and second mapping table 270 may be updated with the storage of the second data (S130, S140).

Specifically, PPN (262_3) indicating the physical page number in which the first data is stored in first nonvolatile memory cell array 310 is updated to indicate that the second data is stored in the second address of second nonvolatile memory indicated by cache index 217_1 of second mapping table 270. Therefore, '0x2002' which is the cache index 217_1 of the second address of second nonvolatile memory cell array 320, is recorded in PPN (262_3).

Meanwhile, physical page number 272_1 corresponding to cache index 271_1 of the second address in second mapping table 270 is undated to indicate that the first data which is the original data of the second data is stored at the first address of first non-volatile memory cell array 310. Thus, '0x0002' which is the first address in which the first data is stored in first nonvolatile memory cell array 310 is recorded in corresponding physical page number 272_1 of second mapping table 270.

In this manner, first mapping table 260 is updated to indicate the second address where the second data is stored in second nonvolatile memory cell array 320, and second mapping table 270 is updated to indicate the first address in first nonvolatile memory cell 310 which stores the original data of the second data, that is, the first data. When there is a request to read the first data from host 100, memory controller 210 may refer to first mapping table 260 or second mapping table 270 as necessary, selectively reads the data from second nonvolatile memory cell array 320 or first nonvolatile memory cell array 310, and provide the data to host 100. A detailed description of the operation will now be described with reference to FIG. 6.

Figure 6:
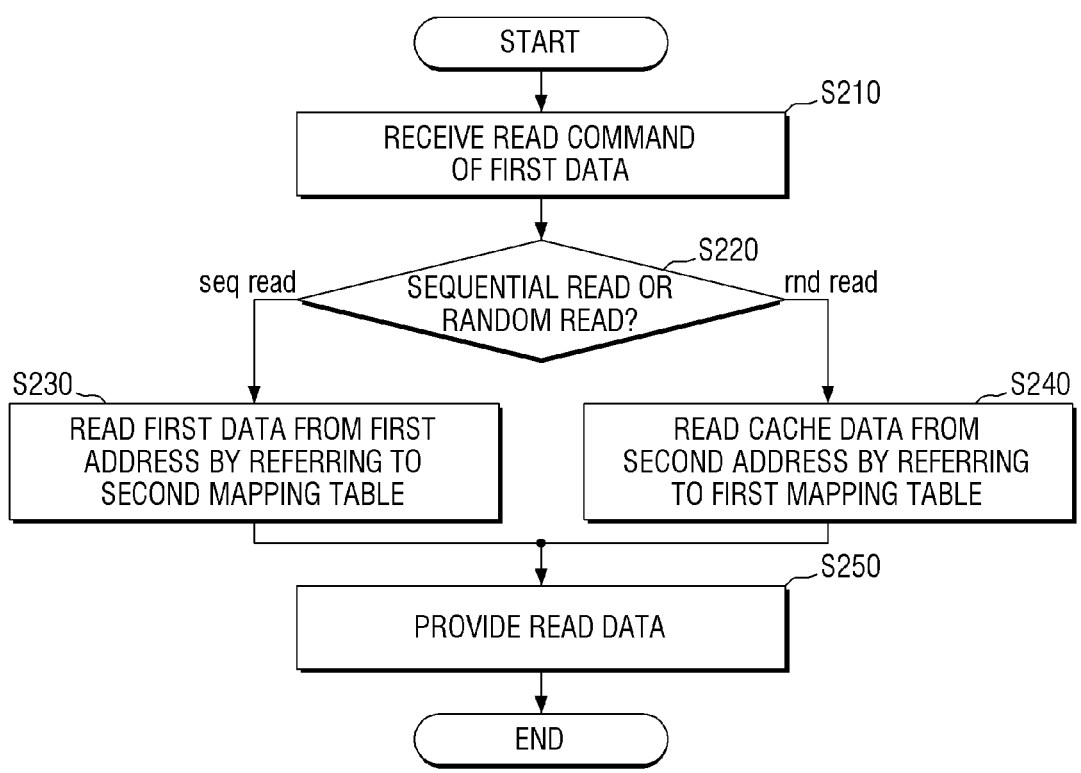
FIG. 6 is a flowchart for explaining the operation of the storage device according to some embodiments of the present invention.

FIG. 6 is a flowchart for explaining the operation of the storage device according to some embodiments of the present invention.

Referring to FIG. 6, a storage device according to some embodiments of the present invention receives a read command for first data from host 100 (S210), and determines whether the read command is a sequential read or a random read (S220). When the read command is the sequential read, the storage device reads the first data from the first address of first nonvolatile memory cell array 310 by referring to second mapping table (S230). When the read command is the random read, the storage device reads the second data from the second address of second nonvolatile memory cell array 320 by referring to first mapping table (S240), and provides the read data to host 100 (S250).

The storage device according to some embodiments of the present invention includes first nonvolatile memory cell array 310, and second nonvolatile memory cell array 320 which stores a part of data stored in first nonvolatile memory cell array 310. As described above, the storage device may include a vertically stacked NAND flash memory. The latency of second nonvolatile memory cell array 320 which stores only one bit in one memory cell and is partitioned with a block size smaller than that of first nonvolatile memory cell array 310 is less than the latency of first nonvolatile memory cell array 310 which stores two or more bits in one memory cell. Accordingly, the memory access for second nonvolatile memory cell array 320 may be faster than memory access for first nonvolatile memory cell array 310. Therefore, in the storage device according to an embodiment of the present invention, second nonvolatile memory cell array 320 may be used as a kind of cache memory.

However, during the read request from host 100, in the case of data in which sequentially of the data is important, reading of the second data by referring to second nonvolatile memory cell array 320 may make the reading performance worse.

For example, in the example of first mapping table 260 and second mapping table 270 illustrated in FIG. 5, a case where there is a sequential read request of data stored in physical page numbers 262_1 to 262_4 corresponding to logical page numbers 261_1 to 261_4 of 0 to 3 is assumed. Since logical page number '3' (262_3) indicates the cache index of second nonvolatile memory cell array 320, there may be a need to perform the read from second nonvolatile memory cell array 320 during the sequential read.

In this case, after reading the data from the physical page numbers '0x0000' and '0x0001' corresponding to logical page numbers 261_1 to 261_2 of '0' to '1', second nonvolatile memory cell array 320 is accessed to obtain the data stored in the physical page number '0x2002' corresponding to logical page number 261_3 of '2', and the data is read again from the physical page number '0x0003' corresponding to logical page number 261_4 of '4'.

That is, the latency by accessing to second nonvolatile memory cell array 320 to read the data is greater than in the case of performing the sequential read to the physical address '0x0000 to 0x0003' of first nonvolatile memory cell array 310.

Therefore, memory controller 210 according to an embodiment of the present invention selects between reading the first data from the first address of first nonvolatile memory cell array by referring to second mapping table 270 based on the read request provided from host 100, or reading the second data from the second address of second nonvolatile memory 320 by referring to first mapping table 260 when the read command is the random read. As a result, it is possible to prevent the sequentially of reading of data, due to an unnecessary access of second nonvolatile memory cell array 320, from being broken.

Figure 7:
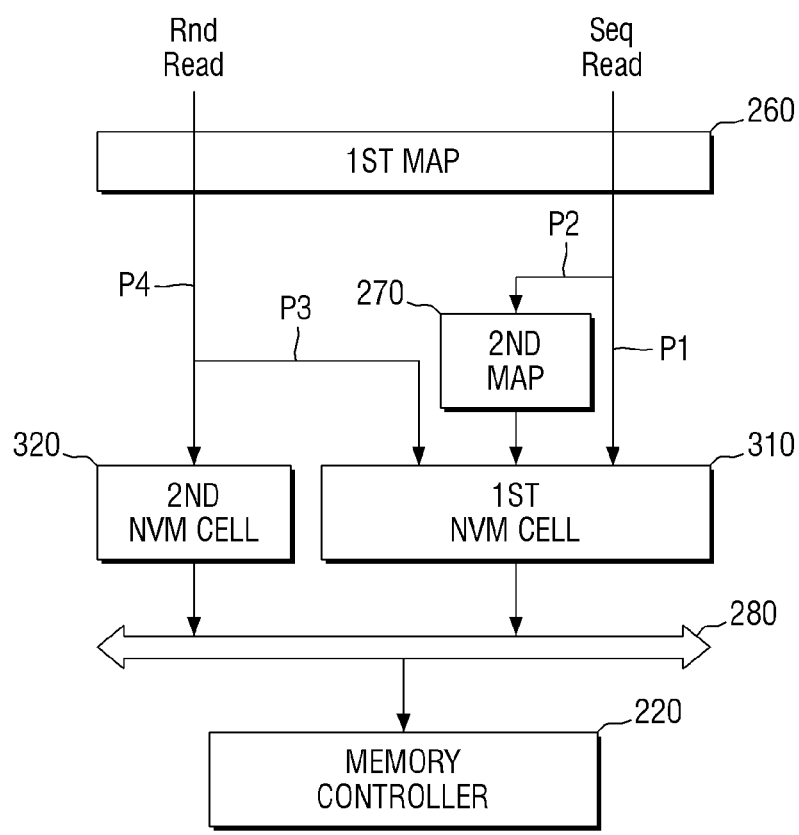
FIG. 7 is a schematic view for explaining the operation of the storage device according to some embodiments of the present invention.

FIG. 7 is a schematic view for explaining the operation of the storage device according to some embodiments of the present invention.

Referring to FIG. 7, when the read command provided to memory controller 210 from host 100 is determined to be a sequential read, memory controller 210 refers to first mapping table 260, and when the second data is not generated (P1), the first data is read from first nonvolatile memory cell array 310 by the sequential read method. On the other hand, when the second data is generated (P2), by referring to second mapping table 270 again, the sequential read from first nonvolatile memory cell array 310 is continued.

On the other hand, when the read command provided to memory controller 210 from host 100 is determined to be a random read, memory controller 210 refers to first mapping table 260, reads unselected data from first nonvolatile memory cell 310 (P3) or reads the second data from second nonvolatile memory cell array 320 (P4).

As described above, memory controller 210 included in the data storage according to the embodiment of the present invention selectively refers to first mapping table 260 and second mapping table 270 in accordance with the nature of the read command provided from host 100, and may read data from first nonvolatile memory cell array 310 or second nonvolatile memory cell array 320.

Next, a scheme in which memory controller 210 determines the nature of the read command provided from host 100 will be described.

Figure 8:
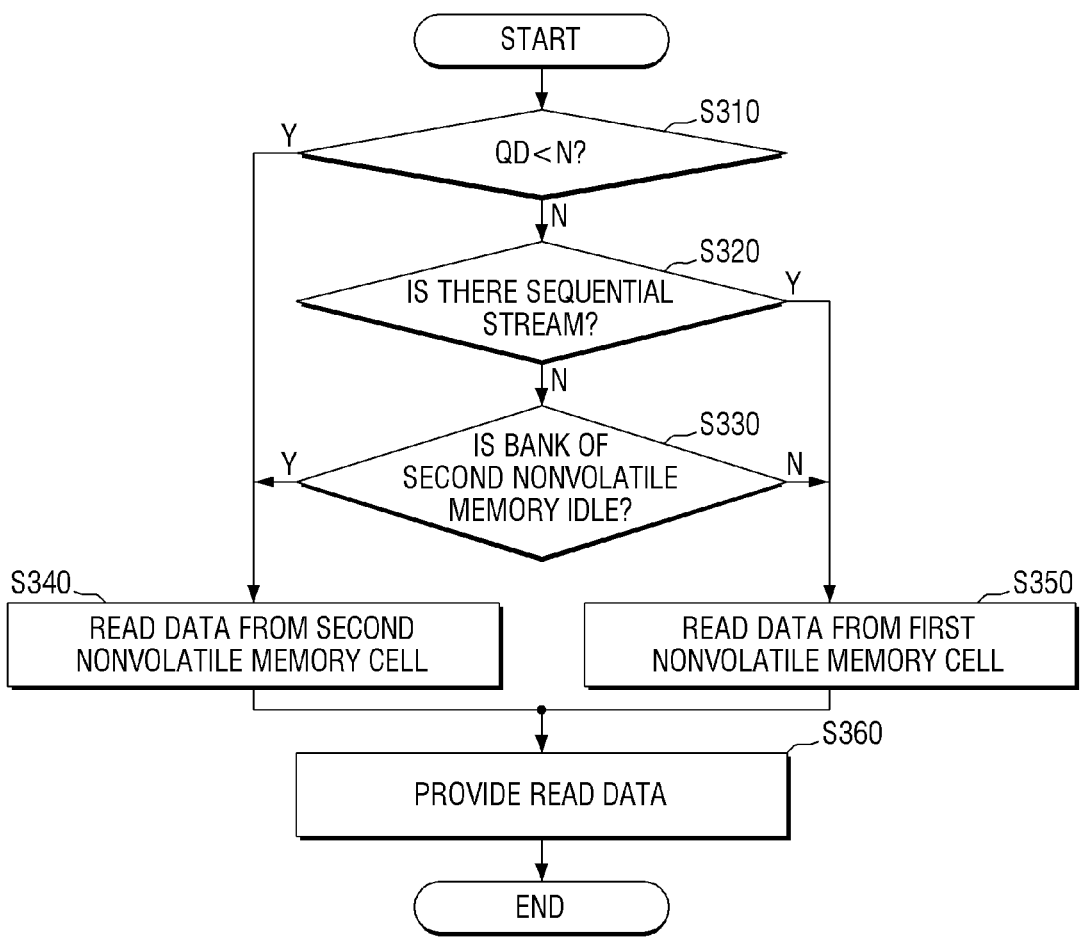
FIG. 8 is a schematic view for explaining the operation of the storage device according to some embodiments of the present invention.

FIG. 8 is a schematic view for explaining the operation of the storage device according to some embodiments of the present invention.

Referring to FIG. 8, memory controller 210 determines whether the Queue Depth (QD) of the command provided from host 100 is larger (greater) than a predetermined reference value (S310). The QD of the command means the number of read and write commands simultaneously provided from host 100 to the storage device.

If the QD of the command provided from host 100 is smaller (less) than a predetermined reference value, this is determined as an access command to an arbitrary or sporadic address, and the second data stored in second nonvolatile memory cell array 320 can be accessed. In contrast, if the QD of the command provided from host 100 is larger (greater) than a predetermined reference value, this is determined as an access command to consecutive addresses, and the first data stored in first nonvolatile memory cell array 310 can be accessed by referring to the address of the original data described in second mapping table 270. In some embodiments of the present invention, the predetermined reference value may be 4, but the present invention is not limited thereto.

Subsequently, memory controller 210 determines whether the command provided from host 100 is a sequential stream (S320). When the command provided from host 100 is an access command for a sequential stream ('Y'), the first data stored in first nonvolatile memory cell array 310 can be accessed, by referring to the address of the original data described in second mapping table 270. In contrast, if the command provided from host 100 is not an access command to a sequential stream ('N'), the second data stored in second nonvolatile memory cell array 320 may be accessed.

Finally, memory controller 210 determines whether the banks of second nonvolatile memory cell array 320 are idle (S330). More specifically, when the banks of second nonvolatile memory cell array 320 are idle, that is, when the expected time of bank busy is short ('Y'), the second data can be read from second nonvolatile memory cell array 320 (S340). Alternatively, when the bank of second nonvolatile memory cell array 320 is busy ('N'), data can be read from first nonvolatile memory cell array 310 (S350).

Although FIG. 8 illustrates the configuration in which memory controller 210 determines all three of: (1) the QD of the command provided from host 100, (2) the presence or absence of the sequential stream, and (3) the state of the bank of second nonvolatile memory cell array 320, the present invention is not limited thereto. That is, memory controller 210 may determine the presence or absence of a sequential read of the command provided from host 100, using at least one of the above three conditions, and it is obvious to a person skilled in the art that two or more conditions among the three conditions also may be combined. Also, the order of the determination of the three conditions may be performed in reverse order, or at the same time, unlike the order illustrated in FIG. 8.

The data read from first or second nonvolatile memory cell array 310, 320 is provided to host 100 (S360).

Figure 9:
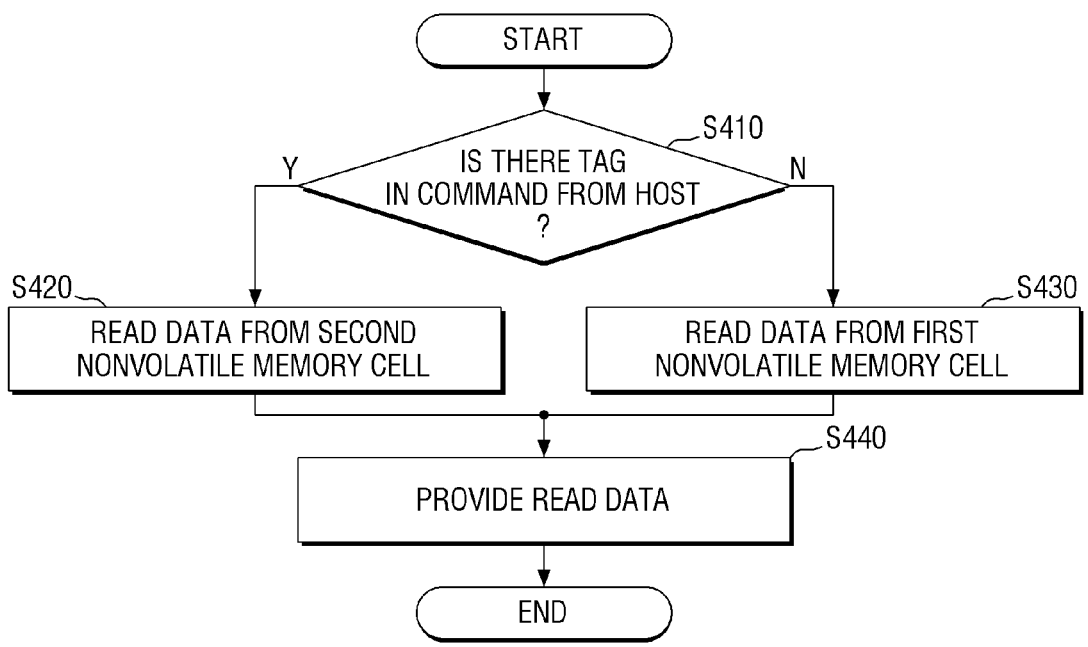
FIG. 9 is a flowchart for explaining the operation of the storage device according to some embodiments of the present invention.

FIG. 9 is a flowchart for explaining the operation of the storage device according to some embodiments of the present invention.

Referring to FIG. 9, another determination criterion of the command provided to memory controller 210 by host 100 is presented. That is, the memory controller 210 determines whether there is a tag provided together with the command provided from host 100 (S410), and if there is a tag ('Y'), the second data can be read from second nonvolatile memory cell array 320 (S420), and if there is no tag ('N'), the data can be read from first nonvolatile memory cell array 310 (S430).

That is, when the command provided from host 100 is forcibly read from second nonvolatile memory cell array 320, it is possible to select whether to read from first or second nonvolatile memory cell array 310, 320 through determination of presence or absence of a tag provided in the command.

In contrast, it is obvious that it is also possible to forcibly read the data from first nonvolatile memory cell array 310 if there is no tag provided in the command.

The data read from first or second nonvolatile memory cell array 310, 320 is provided to host 100 (S440).

Figure 10A:
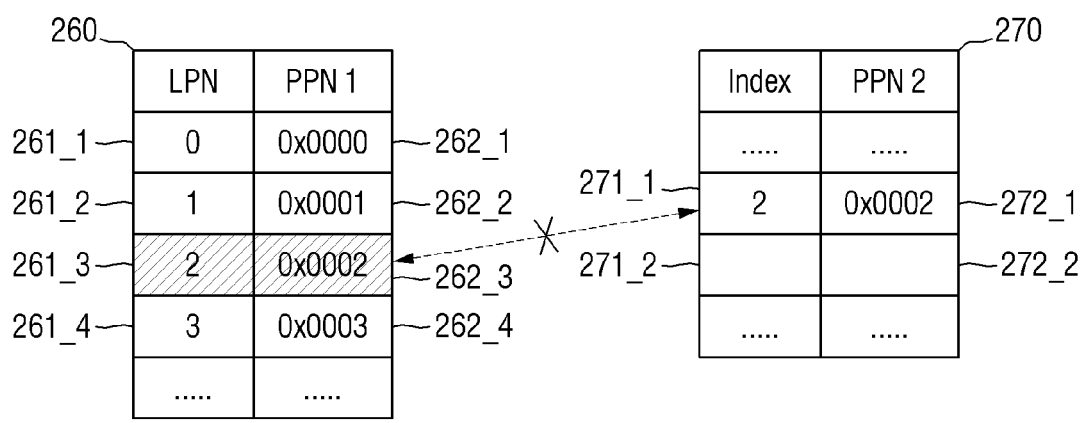
Figure 10B:
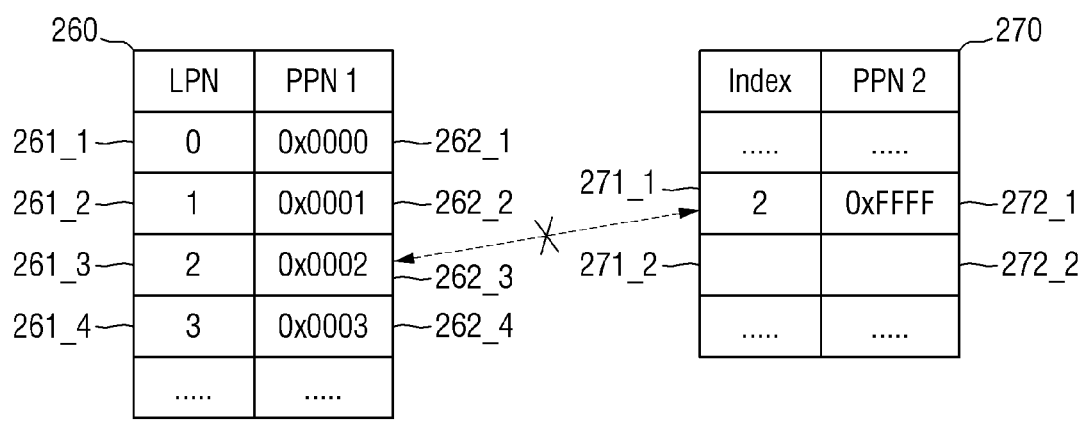

FIGS. 10a to 10c are schematic views for explaining the operation of the storage device according to some embodiments of the present invention.

FIGS. 10a to 10c illustrate the eviction process of the second data stored in second nonvolatile memory cell array 320. First, referring to FIG. 10a, there may be a situation in which a collision occurs in the second data stored in second nonvolatile memory cell array 320 or the second data needs to be deleted for other reasons. At this time, the cache index of second nonvolatile memory cell array 320 recorded in physical page number 262_3 indicating the second address in first mapping table 260 is corrected to the first address 0x0002 in which the first data is stored in first nonvolatile memory cell array 310. As a result, memory controller 210 does not refer to the second data stored in second nonvolatile memory cell array 320 when there is a request to read the second data stored at the second address, but memory controller 210 refers to the first data stored in the first address and provides the first data.

Next, referring to FIGS. 10b and 10c, the first address indicated by physical page number 272_1 of second nonvolatile memory cell array 320 may also be deleted and recorded as 0xFFFF. Also, the second data indicated by cache index 271_1 of the second mapping table 270 may also be deleted. The eviction process of the second data explained by FIGS. 10a to 10c may be executed at the same time, or may be executed in a reverse order of the above process.

Figure 11:
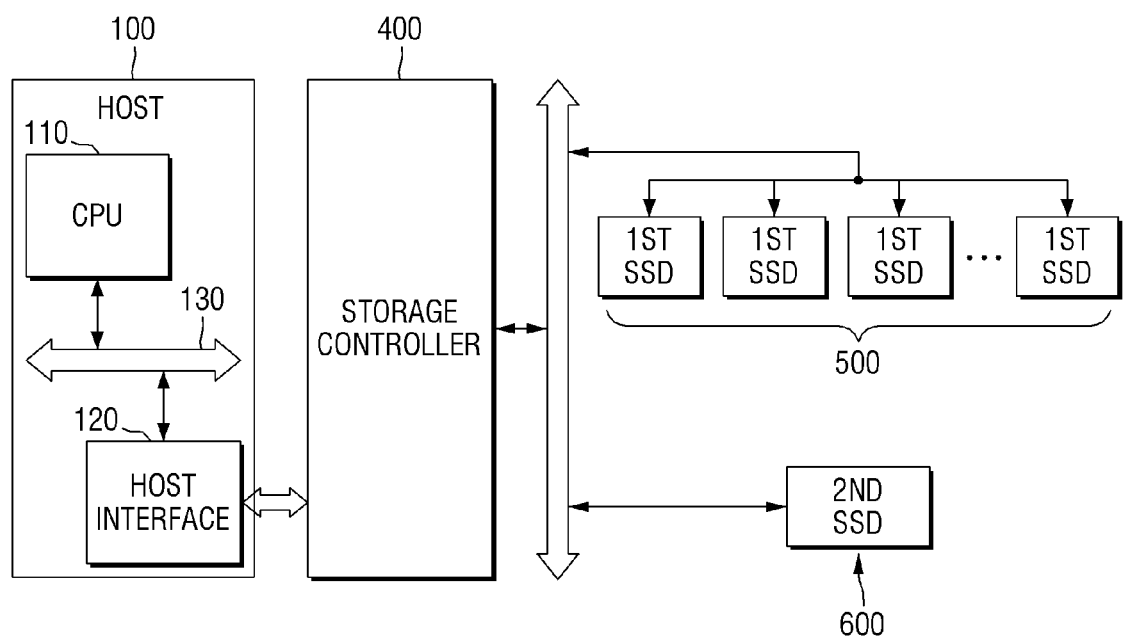
FIG. 11 is a block diagram for explaining a storage system according to some embodiments of the present invention.

FIG. 11 is a block diagram for explaining a storage system according to some embodiments of the present invention.

Referring to FIG. 11, the storage system according to some embodiments of the present invention may include a host 100, a storage controller 400, a plurality of first SSDs 500 and second SSDs 600.

Host 100 may include a CPU 110 and a host interface 120. CPU 110 may generate a read request or a write request that can control the reading operation or the writing operation of storage controller 400. The reading operation may include a reading address and the writing operation may include a writing address. CPU 110 may transmit the generated request to host interface 120 via bus 130.

Host interface 120 manages commands and data to be transmitted to storage controller 400 and may transmit the commands and data to storage controller 400. Further, host interface 120 may manage the data transmitted from storage controller 400 and transmit the data to CPU 110.

Storage controller 400 may access first SSD 500 or second SSD 600 in accordance with a read command or a write command provided from host 100. Similarly to memory controller 210 described above, storage controller 400 may access the data stored in first SSD 500 or second SSD 600 in accordance with the type or nature of the command provided from host 100.

The plurality of first SSDs 500 may include at least one vertically stacked NAND flash memory. In some embodiments of the present invention, the vertically stacked NAND flash memory may comprise an MLC or TLC device or module that stores two or more bits in one memory cell. Similarly to the first nonvolatile memory cell array 310 in the above-described embodiment, first SSD 500 may serve as a main storage which stores the first data.

Second SSD 600 may include, for example, a NAND flash memory cell, and specifically may include an SLC memory module. In some embodiments of the present invention, similarly to second nonvolatile memory cell array 320 in the embodiment described above, second SSD 600 may serve as a cache storage which stores the second data.

Although it is not illustrated in the drawings, the storage device or the storage system according to the embodiment of the present invention may be mounted, using various types of packages. For example, first or second nonvolatile memory cell array 310, 320 and/or memory controller 210 may be mounted, using packages such as Package on Package (PoP), Ball grid arrays (BGAs), Chip scale packages (CSPs), Plastic Leaded Chip Pack (PLCC), Plastic Dual in-Line Package (PDIP), Die in Waffle Pack, Die in Wafer Form, Chip On Board (COB), Ceramic Dual in-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flat Pack (TQFP), System In Package (SIP), Multi Chip Package (mcp), Wafer-level Fabricated Package (WFP), and Wafer-Level Processed Stack Package (WSP). However, the present invention is not limited thereto.

While the present invention has been particularly illustrated and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation.

What is claimed is:

1. A storage device, comprising:
a first nonvolatile memory cell array which includes a plurality of cell strings arranged in a direction perpendicular to a substrate, and which is configured to store first data at a first address;
a second nonvolatile memory cell array which is configured to store at a second address second data selected from the first data, wherein the second data is selected in accordance with a pattern of accessing the first data; and
a memory controller which is configured to manage a first mapping table indicating that the second data is stored at the second address of the second nonvolatile memory cell array, and to manage a second mapping table indicating that the first data as original data of the second data is stored at the first address, wherein the memory controller is configured such that, when it receives a read command for at least a portion of data selected from the first data, in response to the read command the memory controller selects whether to read the first data stored at the first address or to read the second data stored at the second address, based on whether the read command is a sequential read command or a random read command, wherein the memory controller is configured to read the first data from the first address when the read command for the first data is determined to be the sequential read command based on a queue depth of the read command exceeding a reference value, and wherein the memory controller is configured to read the second data from the second address when the read command for the first data is determined to be the random read command based on the queue depth of the read command being less than the reference value.

2. The storage device of claim 1, wherein when it is determined to evict the second data, the memory controller deletes the second data and the first address stored in the second mapping table.

3. The storage device of claim 1, wherein the first mapping table comprises:
a page mapping table, including a logical page number (LPN) and a physical page number (PPN) corresponding to the logical page number.

4. The storage device of claim 1, wherein the second mapping table comprises:
a cache index and a PPN corresponding to the cache index.

5. The storage device of claim 4, wherein the PPN corresponding to the cache index indicates the first address.

6. The storage device of claim 1, wherein the first data stored at the first address of the first nonvolatile memory cell array is stored simultaneously with the second data stored at the second address of the second nonvolatile memory cell array.

7. The storage device of claim 1, wherein the second nonvolatile memory cell array comprises a Single Level Cell (SLC) memory module.

8. The storage device of claim 7, wherein the first nonvolatile memory cell array is divided into first blocks of a first size, and the second nonvolatile memory cell array is divided into second blocks of a second size smaller than the first size.

9. A storage system, comprising:
a host;
a first solid state drive (SSD) which includes a plurality of cell strings arranged in a direction perpendicular to a substrate, and which is configured to store first data at a first address;
a second SSD which is configured to store at a second address second data selected from the first data, wherein the second data is selected in accordance with a pattern of accessing the first data; and
a storage controller which is configured to provide read data to the host from the first SSD or the second SSD in accordance with a read command provided from the host,
wherein the storage controller is configured to manage a first mapping table indicating that the second data is stored at the second address of the second SSD, and a second mapping table indicating that the first data as original data of the second data is stored at the first address, wherein the storage controller is configured such that it, in response to the read command, the storage controller selects whether to read the first data stored at the first address or to read the second data stored at the second address, based on whether the read command is a sequential read command or a random read command, wherein the storage controller is configured to read the first data from the first address when the read command is determined to be the sequential read command based on a queue depth of the read command exceeding a reference value, and wherein the storage controller is configured to read the second data from the second address when the read command is determined to be the random read command based on the queue depth of the read command being less than the reference value.

10. The storage system of claim 9, wherein the host is configured to provide the read command with a tag, and the storage controller provides second data stored at the second address to the host based on the tag of the read command.

11. The storage system of claim 9, wherein the second SSD includes a Single Level Cell (SLC) memory module.

12. The storage system of claim 9, wherein the first mapping table comprises a page mapping table, including a logical page number (LPN) and a physical page number (PPN) corresponding to the logical page number, and wherein the second mapping table comprises a cache index and a PPN corresponding to the cache index.

13. The storage system of claim 9, wherein the first SSD includes a plurality of first blocks having a first block size, and the second nonvolatile memory cell array includes a plurality of second blocks having a second block size which is less than the first block size.

14. A method for operating a storage device, the method comprising:
storing first data at a first address of a first nonvolatile memory cell array, the first nonvolatile memory cell array including a plurality of cell strings arranged in a direction perpendicular to a substrate;
storing second data selected from the first data at a second address of a second nonvolatile memory cell array, wherein the second data is selected in accordance with a pattern of accessing the first data;
updating a first mapping table of the storage device so as to indicate that the second data is stored at the second address of the second nonvolatile memory cell array; and
updating a second mapping table of the storage device to indicate that the first data, which is original data of the second data, is stored at the first address;
receiving a read request for at least a portion of the data selected from the first data;
in response to the received read request, selecting whether to read the first data stored at the first address or to read the second data stored at the second address, based on whether the read command is a sequential read command or a random read command;
reading the first data from the first address when the read command is determined to be the sequential read command based on a queue depth of the read command exceeding a reference value; and
reading the second data from the second address when the read command is determined to be the random read command based on the queue depth of the read command being less than the reference value.

15. The method of claim 14, wherein the first nonvolatile memory cell array a plurality of first blocks having a first block size, and the second nonvolatile memory cell array includes a plurality of second blocks having a second block size which is less than the first block size.

* * * * *